(12) United States Patent
Mckenna et al.

(10) Patent No.: US 10,112,214 B2
(45) Date of Patent: Oct. 30, 2018

(54) ULTRA LOW REFLECTIVITY HYDROPHOBIC COATING AND METHOD THEREFOR

(71) Applicant: SURREY NANOSYSTEMS LIMITED, East Sussex, Sussex (GB)

(72) Inventors: Fiona-Mairead Mckenna, Pulborough (GB); Guy Alexander Howlett, Sudbury (GB); Ben Poul Jensen, Eastbourne (GB)

(73) Assignee: SURREY NANOSYSTEMS LIMITED, East Sussex, Sussex (GB)

( * ) Notice: Subject to any disclaimer, the term of this patent is extended or adjusted under 35 U.S.C. 154(b) by 0 days.

(21) Appl. No.: 15/743,640

(22) PCT Filed: Aug. 26, 2016

(86) PCT No.: PCT/GB2016/052675
§ 371 (c)(1),
(2) Date: Jan. 10, 2018

(87) PCT Pub. No.: WO2017/033031
PCT Pub. Date: Mar. 2, 2017

(65) Prior Publication Data
US 2018/0207679 A1     Jul. 26, 2018

(30) Foreign Application Priority Data

Aug. 27, 2015  (GB) .................................. 1515271.3
Sep. 16, 2015  (GB) .................................. 1516424.7

(51) Int. Cl.
*B05D 1/00* (2006.01)
*C23C 16/02* (2006.01)
(Continued)

(52) U.S. Cl.
CPC ............... *B05D 1/62* (2013.01); *B05D 3/142* (2013.01); *B05D 5/083* (2013.01); *C23C 16/0245* (2013.01); *C23C 16/505* (2013.01)

(58) Field of Classification Search
None
See application file for complete search history.

(56) References Cited

U.S. PATENT DOCUMENTS 9,334,167 B2 * 5/2016 Silva ...................... B82Y 30/00
2006/0228497 A1 * 10/2006 Kumar ................... B82Y 30/00
427/571

(Continued)

FOREIGN PATENT DOCUMENTS

WO   WO 2007/007995   1/2007
WO   WO 2013/009684   1/2013

OTHER PUBLICATIONS

Lau et al., "Superhydrophobic Carbon Nanotube Forests", Nano Letters, 2003, 3(12):1701-1705.

*Primary Examiner* — Shamim Ahmed
(74) *Attorney, Agent, or Firm* — James S. Keddie; Bozicevic, Field & Francis LLP

(57) ABSTRACT

A low reflectivity coating (40, 80/82) is provided on a substrate (22). The coating includes a layer of substantially vertically aligned carbon nanotubes (40) on an exposed surface (21) of the substrate. Provided on and extending partially within the carbon nanotube layer (40) is a hydrophobic coating (80, 82), in the preferred embodiment of or containing fluorocarbon. The hydrophobic coating (80, 82) prevents any settling or ingress of water particles onto or into the carbon nanotube layer (40) and as a result increases the stability of the carbon nanotube layer during use (40) while improving the low reflectivity of the film.

25 Claims, 13 Drawing Sheets

(51) Int. Cl.
*B05D 3/14* (2006.01)
*B05D 5/08* (2006.01)
*C23C 16/505* (2006.01)

(56) References Cited

U.S. PATENT DOCUMENTS

| | | |
|---|---|---|
| 2007/0110982 A1 | 5/2007 | Plissonnier et al. |
| 2008/0164801 A1* | 7/2008 | Min ........................ H01J 9/025 313/309 |
| 2009/0075157 A1* | 3/2009 | Pak ........................ B82Y 30/00 429/530 |
| 2009/0301993 A1 | 12/2009 | Feng et al. |
| 2010/0258111 A1 | 10/2010 | Shah et al. |
| 2011/0311724 A1* | 12/2011 | Jensen .................. B82Y 30/00 427/249.1 |

\* cited by examiner

Ultrapure water droplets on coupons with CVD CNT forests with plasma treatment.
(left) Coupon treated with O2 plasma 15s. (right) Coupon 12s CF4- C2H2 plasma.

After several minutes the water has spread throughout the forest which was treated with O2 plasma (left). The water has not had any effect on the CF4-C2H2 treated sample.

Comparison of samples (vertically aligned CNT forests on foil) treated with CF4-C2H2 plasma (1st, 3rd and 5th) and CF4 only plasma (2nd, 4th and 6th).

IR-THR spectra of three VANTA samples with extended CF4-C2H2 coatings.

IR-THR spectra of three VANTA samples with extended CF4 treatments.

Copper coupons over-etched by CF4 plasma treatment.

Untreated copper sample (left), over-etched (900s) CF4 sample (middle), 300s CF4 treated sample (right)

ULTRA LOW REFLECTIVITY HYDROPHOBIC COATING AND METHOD THEREFOR

CROSS-REFERENCE TO RELATED APPLICATIONS

This application is a § 371 national phase of International Application No. PCT/GB2016/052675, filed on Aug. 26, 2016, which claims the benefit of United Kingdom Patent Application No. 1515271.3, filed on Aug. 27, 2015, and United Kingdom Patent Application No. 1516424.7, filed on Sep. 16, 2015, which applications are incorporated by reference herein.

TECHNICAL FIELD

The present invention relates to a method of forming a low reflectivity hydrophobic coating on a substrate.

BACKGROUND OF THE INVENTION

For a very long time there have been efforts to produce environmentally stable coatings and devices having very low reflectivity for a variety of industrial and scientific applications. These are important in imaging systems, calibration targets, instrumentation, light guides, baffles, stray light suppression and in many other uses.

To be commercially useful, these coatings must have the lowest reflectance possible and be capable of substantially uniform optical absorption over a wide area. Equally importantly, they should preferably exhibit a flat spectral response, low outgassing when exposed to vacuum, high resistance to mechanical shock and vibration with low particulate fallout, good thermal shock resistance and resistance to moisture. These are key requirements for many industrial and scientific applications as the coatings are often local to high sensitivity electronic detectors such as CCD (charged coupled device) or microbolometers. Any contamination from such coatings will inevitably collect or condense on the detectors rendering them faulty or lowering their performance beyond an acceptable threshold.

Until recently, the best black absorber coatings have achieved a total hemispherical reflectance (THR) of around 1.5%, although some experimental studies have achieved better using aligned carbon nanotubes (CNTs). For example, one group managed to achieve a THR of 0.045%. Generally, most aligned carbon nanostructure absorbers have THR's of around 0.5% to 1% in the mid-infra-red (IR) region of the electromagnetic spectrum. When grown at a commercial scale it has proven difficult to reproduce the best performance from aligned carbon nanostructure coatings with any consistency on commercial substrates.

Aligned carbon nanotubes and filaments have been shown to be highly efficient absorbers of electromagnetic energy, and also satisfy many of the key requirements for super-black optical absorbers listed above, but they are prone to attack by atmospheric moisture and humidity. This is caused by growth defects in the carbon nanostructures, which become more pronounced as their synthesis temperature drops below 900° C. As most super-black coatings made from carbon nanotubes are required to be used on sensitive instrumentation, they tend to be grown at the lowest possible temperature that is compatible with the substrate. The chemical vapour deposition (CVD) methods used to grow these coatings tend to result in them being very hydrophilic, as growth defects in the tube walls terminate to form highly polar hydroxyl, carbonyl and carboxyl functional groups on exposure to air or trace oxygen. This hydrophilicity rapidly causes the film to lose its optical properties on exposure to atmospheric humidity or free water, as the film loses its intended highly-absorbing structure and acts like a sponge.

A method that helps to improve the electromagnetic absorption performance of aligned nanostructure films is that of post growth oxygen plasma etching. This has the effect of clustering the nanotube tips, creating a more open structure and a rougher surface topography. This type of post growth process can improve the absorber's performance by over 30% in many cases. However, coatings made from carbon nanostructures that have been treated with an oxygen or other inert gas plasma are highly defective due to ion damage of the nanostructure shells. This leads to the nanostructure coating becoming more hydrophilic so, again, when the absorber coating is exposed to atmospheric humidity or water, severe, full length, CNT tube agglomeration rapidly occurs as the moisture is attracted to the highly polar tube defect sites. This causes uniform local areas of tube densification distributed across the surface exposed to atmospheric moisture. This in-turn radically decreases the coating's ability to act as an absorber, making the film unsuitable for practical applications.

Approaches by research groups who wish to make self-cleaning, super-hydrophobic surfaces have focused on the use of polymer coatings on carbon nanotubes and filaments. Whilst conventional hydrophobic coatings would protect the nanotube coating from water and humidity, they also drastically reduce the combined polymer/absorber film's absorbing properties by changing the film's refractive index, blocking the existing optical trapping cavities and reducing the photon absorption efficiency of the individual nanotubes or filaments.

Metals, semiconductors and materials with metallic behaviour, such as CNTs, demonstrate bandgaps which are generally small enough for an electron to be promoted to an excited state by the energy of an incoming photon. This excitation, followed by extremely fast relaxation through $\pi/\pi^*$ interactions inherent to the structure of graphitic carbon, enables the large uptake of energy observed in these materials. The energies at which these transitions can occur is dependent on CNT structure, size, and environment (i.e. tangled or isolated) and as such can be tuned to occur over a wide spectrum given the correct combination.

Most polymers are insulators, which means that their band gap is too large for an electron to be excited easily by a photon. This means that photons will simply be transmitted, reflected or diffused by the polymer depending on its refractive index and surface roughness.

Molecules and atoms are excited only when the energy of an impinging photon matches the energy difference between the state in which the molecule initially finds itself and some higher energy state of the molecule. To change from a lower quantized energy level to a higher one, the energy of the photon must match the energy gap between the levels. In equation form we can write $$E_{lower\ state} + E_{photon} = E_{upper\ state}$$

That is, in order for light absorption to take place:

$$E_{photon} = h\nu = \Delta E_{molecule} = E_{upper\ state} - E_{lower\ state}$$

Carbon nanostructures demonstrate a feature of one dimensional materials termed Van Hove singularities. These are regions with a high density of states where multiple electronic transitions are possible, causing a very sharp and strong absorption in a narrow band of energy. Metallic and semiconducting CNTs (as well as other 1D materials) demonstrate band gaps (Van Hove singularities) highly dependent on their structure, size and environment. The nature of a vertically aligned forest such as that described in the references below, results in a large distribution of CNT size, length, alignment and crystal structure and hence wide band absorption. It is also known that interactions between nanotubes, such as bundling, results in a wider frequency absorption range. The nature of the bonding in CNTs involving electron delocalisation allows for fast transitions between excited and relaxed states and allows for absorbed energy to be easily dissipated through heat which results from vibrations. When a CNT is over coated in polymer material it makes this absorption far less efficient, resulting in far higher reflectance from the coating.

To date, these issues have not been addressed or resolved in aligned, carbon nanotube or filament electromagnetic (EM) absorber coatings.

One example of an aligned absorber is: US patent application: 20090126783 A1 by Shawn-Yu Lin et al of Rensselaer Polytechnic Institute, entitled: Use of vertical aligned carbon nanotube as a super dark absorber for pv, tpv, radar and infrared absorber application. This publication discloses a visible spectrum highly absorbing aligned carbon nanotube film. The aligned array absorbers are grown using conventional chemical vapour deposition (CVD) techniques at high temperatures >750° C.

A study by N A Tomlin et al, "Decrease in Reflectance of Vertically-Aligned Carbon Nanotubes after Oxygen Plasma Treatment", Carbon Journal (Elsevier) vol. 74, pp. 329-332, August 2014, has suggested that a low reflectivity coating formed of vertically aligned carbon nanotubes could exhibit decreased reflectivity after oxygen plasma treatment.

A study by Kenneth K. S. Lau et al in the Journal Nano Letters, entitled: "Super Hydrophobic Carbon Nanotube Forests", discusses the effect of coating carbon nanotubes in a fluoropolymer to make the surface hydrophobic.

Prior art documents which are not relevant to patentability of the present invention include US2014342954A; FR2887872A; US2008170982A; US2013230695A; US2014011013A; US2014342098A; US2014342103A; US2015173883A; US2012121916A; US2012241687A; US2012276335A; US2013089807A; US2007172666A; US2008118734A; US2009104347A; WO2013/009684 A1 (U.AKRON); CN104631093 A (YANCHENG); US2007/0110982 A1 (PLISSONNIER); Tomlin, Curtin, White, Lehman, "Decrease in reflectance of vertically-aligned carbon nanotubes after oxygen plasma treatment", Carbon, 2014, volume 74, pages 329-332, Elsevier; Lau, Bico, Teo, Chhowalla, Amaratunga, Milne, McKinley, Gleason, "Superhydrophobic carbon nanotube forests", nano letters, 2003, volume 3, number 12, pages 1701-1705, American chemical society; US2009/0050601 A1 (PARK); WO2009/083562 A1 (ESSILOR); US2010/0285301 A1 (DIEUDONNE); and Xie, Wang, Cui, Shi, "No—Fe—Co—P coatings on coiled carbon nanofibers", Letters to the Editor, Carbon, 2005, volume 43, pages 3181-3183, Elsevier.

SUMMARY OF THE INVENTION

The present invention seeks to provide an improved ultra-low reflectivity coating and method for producing such a coating. The preferred embodiments disclosed herein provide a method to reduce the reflectance from an 'as grown' carbon nanostructure coating, whilst at the same time providing a $CF_x$ functionalisation of polar defect sites and a super-hydrophobic, partial coating, that results in a super hydrophobic structure that does not interfere with its absorbing properties.

According to an aspect of the present invention, there is provided a method of forming a low reflectivity hydrophobic coating on a substrate, including the steps of: providing in a reaction chamber a substrate having a layer of carbon nanostructures on the substrate, supplying the reaction chamber with a coating precursor which includes a fluorocarbon, generating a plasma in the reaction chamber, in order to deposit a hydrophobic coating on at least a part of said layer of carbon nanostructures, wherein either the plasma generation takes place in the absence of a source of hydrogen atoms, in which case the substrate is heated to at least 100° C. (preferably from 100° C. to 300° C.), the power density of the plasma is not more than 0.1 $Wcm^{-2}$ and the plasma is generated for a period from 3 to 12 minutes, or the plasma generation takes place in the presence of a source of hydrogen atoms, in which case the power density of the plasma is not more than 0.2 $Wcm^{-2}$ and the plasma is generated for a period from 5 to 14 seconds.

The teachings of the preferred embodiments described herein are directed to the deposition and functionalization by a plasma fluoropolymer onto a carbon nanotube array in order to improve hydrophobicity whilst simultaneously improving optical absorption characteristics in the electromagnetic spectrum.

In a practical embodiment, the coating has a low surface energy, which causes the coating to be hydrophobic.

The disclosed method of making the carbon nanostructure layer hydrophobic and lowering the surface energy can also significantly improve the film's absorption across the electromagnetic spectrum due to the tip clustering produced during exposure to the plasma.

The inventors have discovered that the hydrophobic coating and etch process taught herein, surprisingly, improves the film's reflectivity by the same as an oxygen only process.

In the preferred embodiment, the hydrophobic material coating is discontinuous across the layer of carbon nanostructures and preferably also extends at least partially through a thickness of the carbon nanostructure layer. The coating does not have to be a continuous film as long as the nanostructure tips are coated as the tip density and high contact angle will result in a lack of capillary action thereby restricting water ingress. In a practical embodiment, the hydrophobic coating extends to at least 3 micrometers along the lengths of the nanostructures without forming a continuous over-layer, but the surface energy modification can substantially extend the full length of the carbon nanostructure. In some embodiments, the coating may thus extend for the full length of the nanostructures.

In a practical embodiment, the carbon nanostructures are filamentary and extend generally from the internal side to the exposed side, the hydrophobic coating being disposed over at least a part of the length of the filamentary nanostructures. The nanostructures in practice may be nanotubes, filaments or rods. The filamentary nanostructures may be straight, curved or wavy.

In a practical embodiment, the hydrophobic material includes carbon tetrafluoride as a precursor. Other embodiments, described below, may use other precursors. The precursors could be used individually, or in combination of two or more, and may or may not be used with an additional reactant, such as acetylene.

As would be known to a person skilled in the art, the length, size, diameter and density of the nanostructures can be tuned for absorbing different wavelengths of electromagnetic spectrum.

According to another aspect of the present invention, there is provided a method of forming a low reflectivity hydrophilic coating on a substrate, which coating includes a layer of carbon nanostructures attached to a substrate and extending away from the substrate, the carbon nanostructure layer having an internal side and an exposed side, the internal side facing the substrate, the carbon nanostructures having tips at the exposed side of the of the carbon nanostructure layer; the method including the steps of:

generating a plasma at the layer of carbon nanostructures, the plasma including fluorine and carbon or organosilane and carbon components;

causing by means of the plasma:

a) the tips of the carbon nanostructures to cluster together and
b) a coating of fluorocarbon or organosilane to be formed partially over the carbon nanostructure layer, wherein the coating is hydrophobic.

The fluorocarbon or organosilane coating lowers the surface energy of the exposed surface of the carbon nanostructure layer, thereby causing the layer to be hydrophobic.

In some embodiments, the method includes the step of generating a plasma with selected precursors to create the hydrophobic material and lower the surface energy, wherein hydrophobic material is coated on the carbon nanostructure layer during the course of the plasma reaction. The plasma is preferably created in a typical PECVD reactor by RF, DC, PDC, ICP or Microwave or remote microwave.

The hydrophobic material is preferably coated at least partially through a thickness of the carbon nanostructure layer.

Advantageously, the filamentary nanostructures at the exposed side of the carbon nanostructure layer are coupled together in clumps or clusters.

The hydrophobic material preferably is or includes a fluoropolymer. In a practical embodiment, the hydrophobic material includes carbon tetrafluoride as a precursor. The precursor may be used by itself but in other embodiments, the carbon tetrafluoride precursor is provided with a hydrocarbon reactant, advantageously of acetylene. In a practical embodiment, the carbon tetrafluoride and acetylene are provided at a ratio of substantially 90% to 10%, respectively. In a practical embodiment, the plasma is generated at about 100 degrees Centigrade by means of RF energy at a frequency of 13.56 MHz. The RF energy is delivered to an electrode in a way typically used in PECVD reactors. Suitable RF powers, electrode spacing and process pressures can be used to minimise precursor fragmentation. Advantageously, the plasma is formed at a pressure of around 1.2 Torr.

In the preferred embodiment, the method includes the step of etching at least a part of the carbon nanostructure layer. The etching step is performed concurrently with the coating step. It is envisaged that in some embodiments, the carbon nanostructure layer may be pre-etched by an oxygen plasma treatment and then hydrophobically coated.

According to another aspect of the present invention, there is provided apparatus for providing a low reflectivity coating, which coating includes a layer of carbon nanostructures attached to a substrate and extending away from the substrate, the carbon nanostructure layer having an internal side and an exposed side, the internal side facing the substrate, the carbon nanostructures having tips at the exposed side of the of the carbon nanostructure layer, wherein at least a part of the exposed side has a hydrophobic coating thereon, the coating being or including a fluorocarbon or organosilane; the apparatus including:

a sealable chamber;

first and second electrodes disposed in the chamber, one of the first and second electrodes being arranged to support the substrate;

a plasma generator operable to generate a plasma in the chamber; and a source of fluorine, fluorocarbon or organosilane material coupled to the chamber, the apparatus being operable to generate a plasma containing said fluorine, fluorocarbon or organosilane material, wherein said material forms a hydrophobic fluorocarbon or organosilane coating over said carbon nanostructure layer during the plasma.

The plasma generator may be a PECVD reactor operated by RF, DC, PDC or Microwave or remote microwave.

Preferably, the apparatus includes a control unit provided with a timing device. Advantageously, the timing device is controllable to stop the generation of the plasma at a time when hydrophobic material is coated at least partially through a thickness of the carbon nanostructure layer. This may be in the region of 8 to 15 seconds.

In a practical embodiment, the source of hydrophobic material is or includes carbon tetrafluoride as a precursor. The precursor may be used by itself but in other embodiments the source may include an additional reactant such as acetylene. In a practical embodiment, the source includes carbon tetrafluoride and acetylene at a ratio of substantially 90% to 10%, respectively.

The plasma generator is preferably operable to generate a plasma with the substrate at about 100 degrees Centigrade. In some embodiments, the plasma is created by means of RF energy at a power suitable for the substrate size, precursors and reactor configuration. Advantageously, the plasma is at a pressure of around 1.2 Torr.

The displacement of carbonyl and carboxyl groups through fluorination is thought to render the structure hydrophobic due to the inability of C—F bonds to accept protons necessary for the formation of hydrogen bonds. The fluorine content of carbon nanotubes increases with temperature up to a maximum coverage of C2F between 250° C. and 300° C. Fluorine bonding shows two different bonding types, depending on the location of the F in the ring. Fluorination of the ring at low temperature is only possible at neighbouring carbon atoms (1,2) generating a meta-stable state where re-combination of the fluorine atoms and degradation of the ring structure may occur through interaction with water or other solvents. A significantly more stable configuration requires the rearrangement of the F atoms to a (1,4) configuration at opposite sides of the ring. The strength of the C—F bond in this case increases to a more covalent character with greater stability. To reach this position, fluorine needs to migrate through the energetically unfavourable next nearest neighbour configuration at (1, 3). At temperatures between 250 and 300° C. the required activation energy to overcome this thermodynamic obstacle is achieved. Above these temperatures, the graphitic integrity of the tubes begins to break down into amorphous material where coverage can approach CF.

Without wishing to be constrained by theory, it is thought that if a fluorocarbon like CF4 is used on its own the substrate temperature must be heated to at least 100° C., but preferably 250° C.-300° C. (above 300 C the bond is damaged so isn't stable), and the functionalisation takes about 5 minutes at very low power density (about 0.09

Watts/cm sq). A solid film is not thought to be created as there is no hydrogen present to polymerise the reactants. The fluorocarbon radicals simply displace the carboxyl and other polar groups on the CNT defect sites whilst reducing the reflectance of the film by clustering the CNT tips. The time range is from 3 minutes to 12 minutes. Beyond this time the film is damaged in terms of reflectance.

Other features and advantages will become apparent from the description and drawings which follow.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

The Figures show in schematic form embodiments of apparatus for coating a substrate with a carbon nanostructure layer having very low and preferably ultra-low reflectivity. The embodiments disclosed herein can make a coated article having a reflectivity considerably less than 2.5% and in most cases of less than 0.5%. The preferred embodiments have exhibited a reflectivity of less than 0.05%, typically of 0.035% or so.

Figure 1:
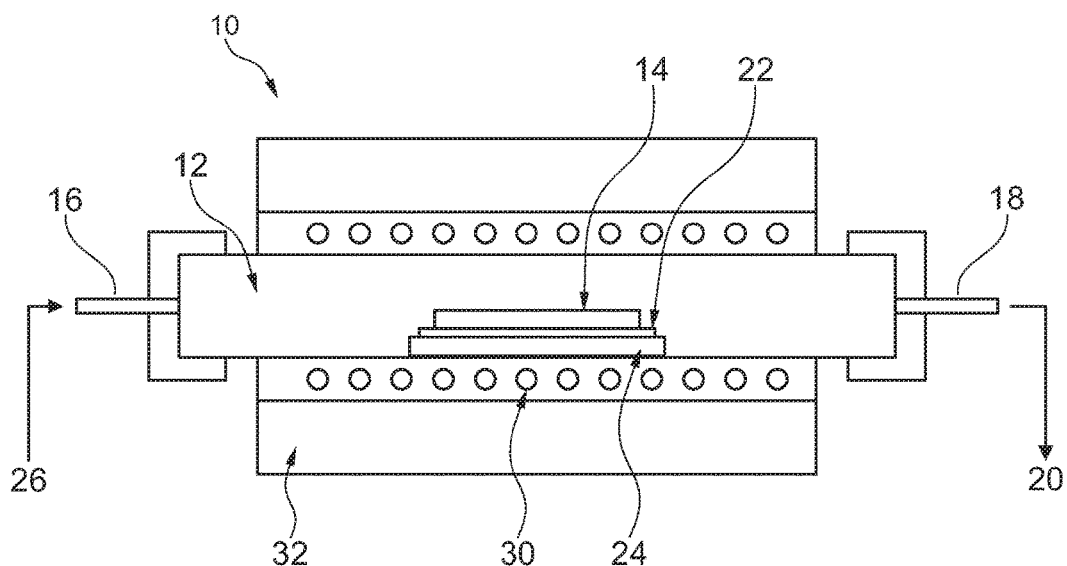
FIG. 1 is a schematic diagram of an embodiment of apparatus for generating a carbon nanostructure coating on a substrate.

Referring first to FIG. 1, this shows in schematic form the basic components of a (CVD) chemical vapour deposition system for forming a layer of carbon microstructures on a substrate. In the preferred embodiments these structures are filamentary elements, commonly referred to as carbon nanotubes, rods or filaments.

The apparatus 10 includes a sealable chamber 12 made from an optically transmissive material such as quartz. This type of reactor is typically known as a hot wall CVD reactor. Other reactor types such as cold wall CVD reactors may be used as the process of growing the nanostructures is generally the same in either reactor type. The sealable quartz chamber 12 is heated by external heating elements 30 in a furnace body 32, to a temperature suitable for the growth of a layer of carbon nanostructures 14, in this example 700-1,000° C. The sealable chamber 12 has a gas inlet 16 and a gas outlet 18 at opposing ends. The chamber 12 is operated below atmospheric pressure and pumped by a suitable vacuum pumping system 20. The substrate 22 is loaded into the reactor on a sample holder 24, and the pressure in the reactor is reduced to remove all air and other contamination. Gas 26 is then allowed to flow, and a specific pressure is set by the control system of the apparatus. Once a steady pressure has been reached the temperature in the reactor is increased to its operating condition, typically 700-1,000° C. Once the sample 22 has reached a suitable temperature, an additional reactive gas, namely carbon source gas, is introduced. This source gas reacts with the catalyst coated substrate causing carbon nanostructures 14 to form. If a suitable catalyst has been used, the nanostructures 14 should be self-supporting and aligned vertically from the substrate surface. The coated substrate 22 is then transferred to a plasma enhanced chemical vapour deposition (PECVD) type reactor to provide for hydrophobic coating and tip clustering.

Figure 2:
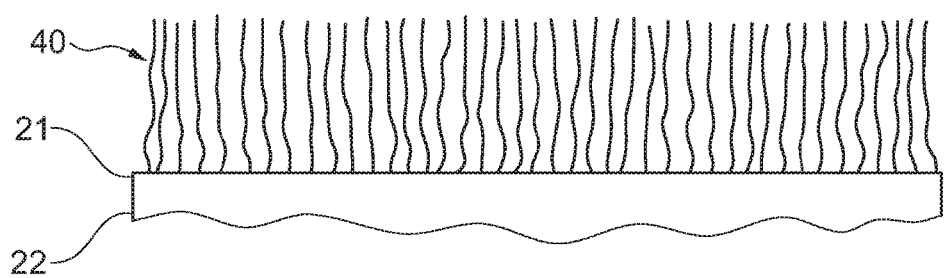
FIG. 2 is an enlarged view of the carbon nanostructure layer formed by the apparatus of FIG. 1.

Referring to FIG. 2, this shows in enlarged form the carbon nanostructure layer on the substrate 22 produced by operation of the apparatus of FIG. 1. When the apparatus 10 is operated, carbon is deposited on the exposed surface 21 of the substrate 22 to form an array of tightly packed carbon nanotubes 40 which extend generally perpendicularly from the surface 21. Each carbon nanotube 40, which could be described as a filamentary element, may be substantially straight although often will have a slightly irregular shape which can be described as curving or wavy.

The elements of the carbon nanostructure may have a diameter of 2 to 30 nanometers and a length from 3 micrometers to 2 millimeters. Longer elements are more suitable to absorbing longer wavelength radiation. For absorbing light in the infrared to ultraviolet wavelengths, elements having a length in the region of 50 micrometers are suitable.

Whilst a coating such as that shown in FIG. 2 can have low reflectivity, absorbing most light incident thereon, it has been found that by further treatment of the coating improvements can be achieved in terms of reduction in reflectivity.

Figure 3:
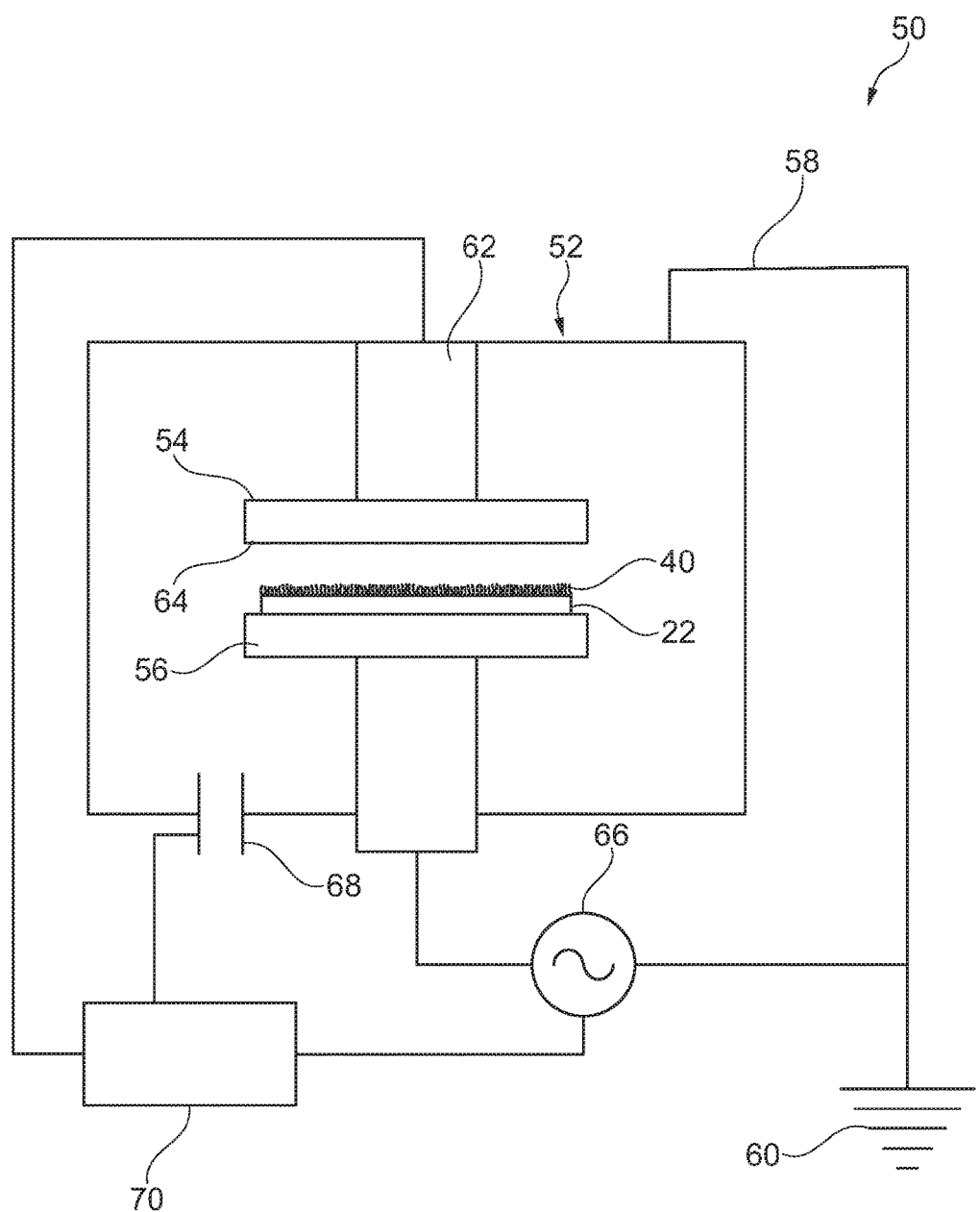
FIG. 3 is a schematic diagram of an embodiment of plasma finishing apparatus.

Referring now to FIG. 3, this shows an embodiment of apparatus 50 for inducing clumping, clustering or agglomeration (hereinafter referred to generally as clustering) of the free ends of the carbon nanotubes 40 in order to reduce the reflectivity of the carbon nanotube layer 14, as well as to coat the carbon nanostructure layer with a hydrophobic material. The apparatus 50 shown in FIG. 3 includes a sealable chamber 52, in which are disposed, in this embodiment, first and second electrodes 54, 56. The electrodes 54, 56 are plate-like structures which are substantially square or rectangular in plain view and specifically shaped and sized to be able to accommodate the shape and size of an article to be coated by the apparatus. The electrodes 54, 56 do not need to have the specific form shown in FIG. 1 or disclosed herein.

The first electrode 54 in the configuration shown in FIG. 3 forms the anode and is coupled by a conductor 58, typically a wire, to electrical ground 60. Coupled to the electrode 54 is a material source 62, which in the preferred embodiment is a mixture of carbon tetrafluoride as a precursor and acetylene, or other suitable reactants that are capable of lowering surface energy in the carbon nanotube array and depositing a hydrophobic layer. In one example, carbon tetrafluoride as a precursor and acetylene are provided in the ratio of 90% to 10%, respectively. The supply of gases by the source 62 can be controlled by a suitable device such as a mass flow controller (not shown in FIG. 3). The gases provided by the source 62 can be pre-mixed or alternatively provided from separate pure gas supplies, mixed together in the source 62 under the control of a control unit 70, as described in further detail below.

The source of gas 62 is coupled to the electrode 54, such that during operation of the apparatus 50 gas enters from nozzle or nozzles in a face plate 64 of the electrode 54, creating a plasma for the deposition of a fluorocarbon or organosilane coating on an article in order to lower the surface energy of the film and to make the layer hydrophobic.

The second electrode 56 is coupled to a power supply 66, which in this embodiment is an alternating current supply. In other embodiments, the alternating current source 66 may be replaced by a DC or Pulsed DC power supply having its negative terminal coupled to the cathode 56, or a remote microwave plasma source can also be used.

The electrode 56 may be an assembly of components, including elements for maintaining a specific substrate temperature in order to enable the deposition, clustering and reduction in surface energy to be optimised for a given reactor configuration, as described for example in the applicant's earlier patent application EP-1,885,909.

Coupled to the chamber 52 is an outlet 68 connected to a vacuum pump (not shown in FIG. 3) able to evacuate air within the chamber 52, as is well known in the art.

An article, generally a substrate 22, can be placed in electrical contact with the second electrode 56 with its carbon nanostructure layer facing the upper or first electrode 54. In the preferred embodiment, the electrodes 54, 56 are sized to extend beyond the lateral peripheries of the substrate 22.

The apparatus 50 also includes a control unit 70, which is typically provided with a user interface (not shown) for enabling the user to set process parameters for the apparatus 50 and to provide feedback on the progress of operation of the apparatus 50 during the procedure of coating the carbon nanostructures 40 with the fluorocarbon material. The control unit 70 will also include user feedback units, such as a display, one or more acoustic and/or visual warning indicators, all of a type familiar to the skilled person and therefore not described in detail herein.

The control unit 70 is coupled to the vacuum element 68, specifically to a vacuum pump, to the fluid source 62 or to any mass flow controller of the fluid supply 62. The control unit 70 is also coupled to the power supply 66, such that the control unit 70 is able to control operation of the apparatus 50 and in particular the generation of a plasma within the chamber 52 and therefrom the process of applying to the free surface or surfaces 40 of the substrate 22 a layer of fluorocarbon material.

Figure 4:
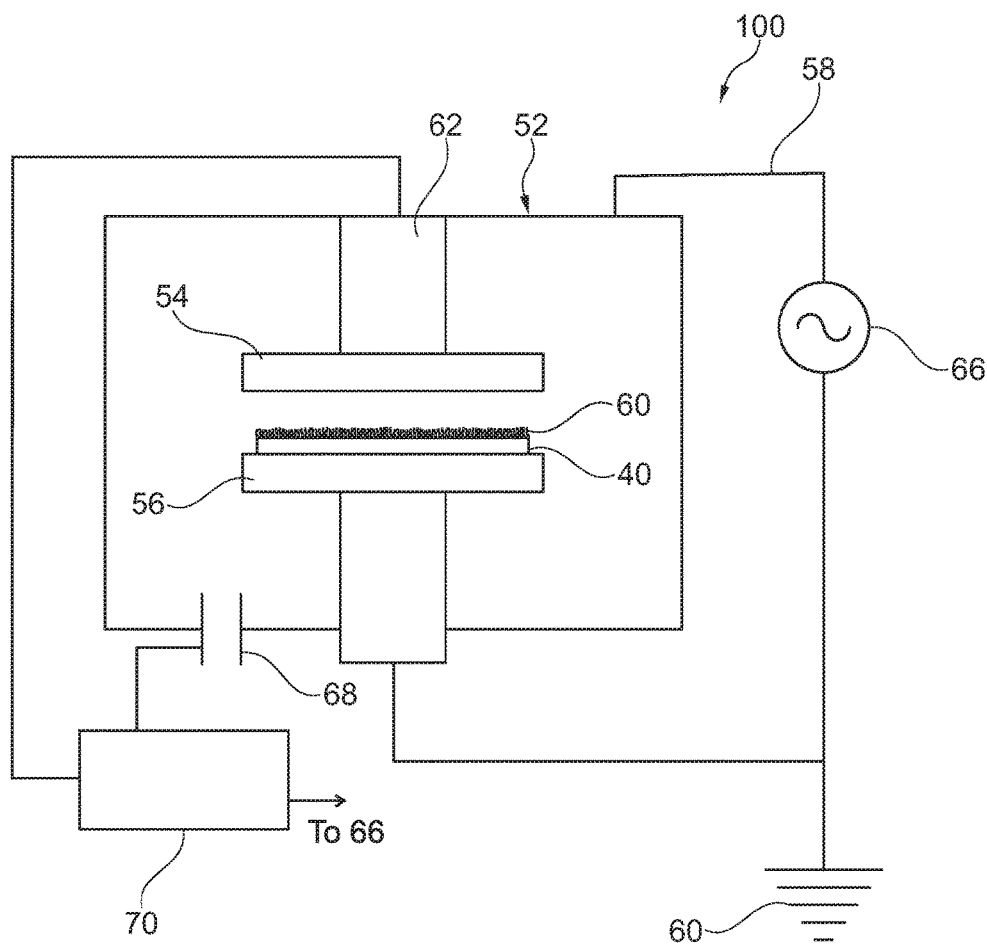
FIG. 4 is a schematic diagram of another embodiment of plasma finishing apparatus.

Referring now to FIG. 4, this shows another embodiment of apparatus for inducing clustering of the free ends of the carbon nanotubes 40 in order to reduce the reflectivity of the carbon nanotube layer 14 as well as coating the carbon nanostructure layer. The apparatus 100 shown in FIG. 4 is substantially the same as that shown in FIG. 3, save for the arrangement of the power supply to the electrodes. As can be seen in FIG. 4, the alternating current supply 66 is coupled to the first electrode 54, whereas the second electrode 56, which supports the substrate 22 and the carbon nanotube layer 40 thereon, is coupled directly to ground. The control unit 70 is coupled to the power supply 66 to control the supply of power to the first electrode 54. The power supply 66 can be of any of the types mentioned above.

Figure 5:
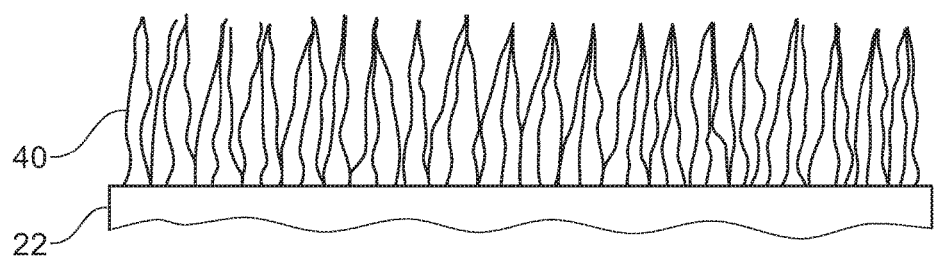
FIG. 5 is a schematic enlarged view of an example of etched carbon nanostructure layer.

It is possible with the apparatus shown in FIGS. 3 and 4 for the supply 62 to be of oxygen gas, used to generate an oxygen plasma in the chamber 52. Such an oxygen plasma, typically produced for a period of around 15 seconds, will cause clustering of the free ends of the carbon nanotubes 40, in the manner shown in FIG. 5. Clustering of the free ends of the carbon nanotubes 40 in this manner can reduce the reflectivity of the layer beyond the arrangement shown in FIG. 2. However, the inventors have discovered that the use of an oxygen plasma to cluster the free tips of the carbon nanotubes 40 results in the creation of defects in the surfaces of the carbon nanotubes 40, which can increase the hydrophilicity of the layer 40, making the layer 40 prone to trapping moisture. Moisture can lead to degradation of the layer 40 and adversely affect the reflectivity of the layer 40, in that when wetted or in contact with high levels of humidity, the layer 40 becomes significantly more reflective.

More specifically, whilst oxygen etching CNT aligned films for very short periods of time (8-15 seconds) helps to improve the films electromagnetic absorption characteristics, oxygen etching alone renders the carbon nanotubes in the film hydrophilic, causing them to fully agglomerate when exposed to atmospheric water vapour/humidity, and lose their absorptive properties. Whilst minor tip agglomeration/clustering is suitable for improving optical properties, agglomeration from water vapour is undesirable as the tubes 'wick' together along their length, forming discrete, high density islands thereby allowing electromagnetic radiation to bounce off the island surface or to hit the substrate surface in between the islands, essentially destroying any beneficial optical properties.

In order to mitigate this problem, according to the teachings herein, after treatment in an oxygen plasma, a further treatment can be effected by creating a plasma including fluorine or an organosilane with or without an additional hydrocarbon reactant. In the preferred embodiment this is achieved by using carbon tetrafluoride as a precursor with acetylene, supplied via the source 62. This results in the deposition of a layer of fluorocarbon material on at least a part of the nanostructures that form the layer 40, which creates a hydrophobic coating on the layer 40. The preferred parameters and characteristics of the hydrophobic coating are described herein in connection with a one-stage coating process.

In the preferred embodiments, on the other hand, the oxygen plasma treatment step described above is omitted and instead clustering and coating with the hydrophobic material occur in a single combined process, that is by plasma containing fluorine and a hydrocarbon generated in the chamber 52. It has been found that by this process improvements are achieved in terms of a further reduction in total hemispherical reflectance and also improvements in hydrophobicity.

Figure 6:
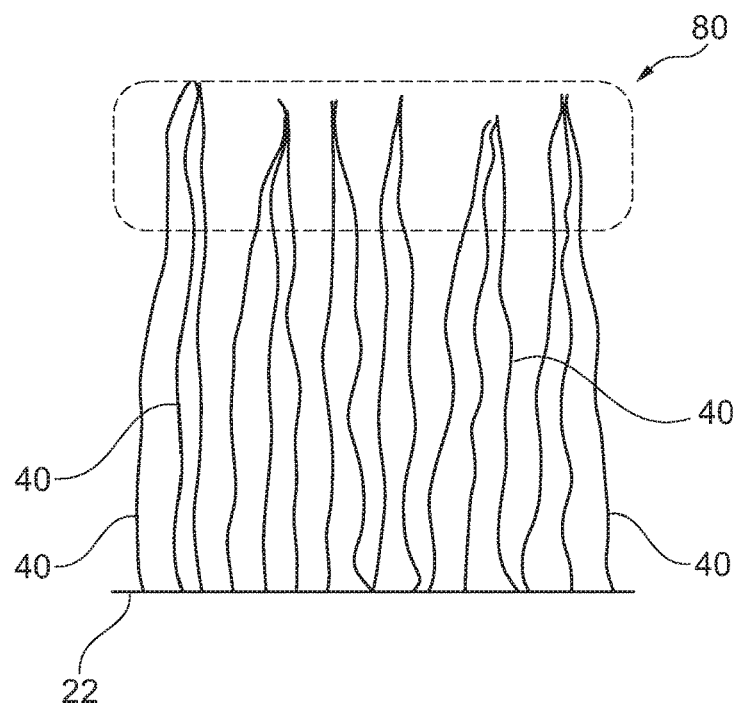
FIGS. 6 and 7 depict an example of hydrophobic coating on the carbon nanostructure layer.
Figure 7:
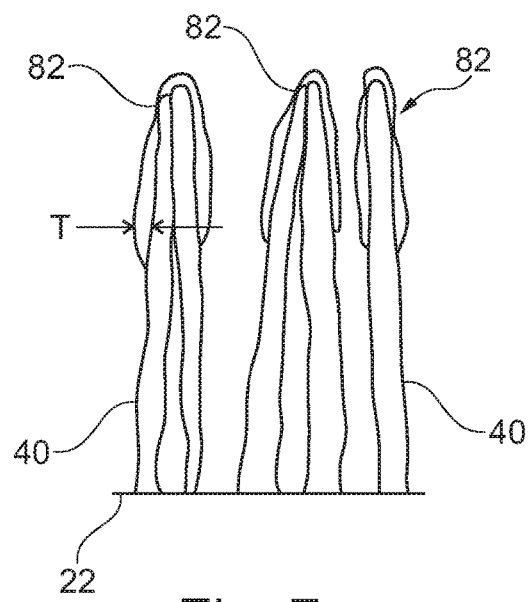

Referring in general terms to FIGS. 6 and 7, in the preferred embodiment a coating 80 is applied to at least the free or outer surface of the layer 40 of carbon nanotubes, which imparts to the carbon nanotube layer 40 a hydrophobic quality which prevents any settling or ingress of water on or into the carbon nanostructure layer 40. It has been found that this ensures that layer 40 maintains optimum low reflectivity during normal usage conditions. With reference to FIG. 7, the coating 80 can be seen disposed over the outer surfaces of the clustered carbon nanotubes 40 and this coating 82 extends, in the preferred embodiments, only part-way through the thickness of the carbon nanostructure layer 40. As will be apparent form the Figure, the coating 82 is also discontinuous across the layer of carbon nanostructures 40, allowing penetration of light into the layer of carbon nanostructures and optimising THR. It has been found that it is not necessary to coat the whole depth of the carbon nanostructure layer 40, as a coating at only the outer surface of the layer 40 is sufficient to make the entire layer 40 hydrophobic and to prevent any settling or ingress of water particles. It has been found that in most practical embodiments, the coating 80/82 need only extend up to around 3 micrometers of the total depth of the layer 40 (or length of the carbon nanotubes). The coating does not need to form a continuous film across the nanostructured surface. In fact, if fully coated (across the gaps between the tubes) the optical properties of the film will degrade or be destroyed as the fluoropolymer will have a far higher refractive index than the open, cluster-tipped film. Partial coverage is sufficient to make the surface completely hydrophobic as the density of the tubes, once hydrophobic, is typically sufficient to prevent water entry by capillary action.

A side effect of plasma clustering and hydrophobic coating is that tube defects that can lead to the film becoming hydrophilic are also substantially altered by the reactive chemical species in the plasma. The defect sites are typically carboxyl, carbonyl or hydroxyl groups formed during growth, from residual oxygen containing compounds found in the reactor, or once any unstable bonds in the nanostructure have been exposed to air, or induced by interaction with a plasma due to energetic ion bombardment of the tube structure during clustering. These carboxyl, carbonyl or hydroxyl groups make the carbon nanostructure highly polar, thereby turning the coating hydrophilic. The inventors believe that on exposure to the $CF_x$ radicals any highly polar carboxyl, carbonyl and hydroxyl groups in the uncoated areas will have a high probability of being displaced by $CF_x$ radicals leading to formation of less polar CF2/CF3 functional groups, thereby causing the film's surface energy to be lowered overall and its hydrophobicity to be improved.

It is preferred that the hydrophobic coating 80/82 is or includes a fluorocarbon, which is particularly hydrophobic and bonds efficiently to the carbon nanostructures. It has also been discovered that $CF_x$ radicals can functionalise any defects in the surfaces of the carbon nanostructures 40. Although a fluorocarbon is the preferred material for the coating, other hydrophobic coating materials can be used, such as organosilane based precursors.

In an embodiment, the hydrophobic functional coating is obtained from PECVD of a fluorocarbon obtained from a supply of carbon tetrafluoride ($CF_4$) used as precursor.

The process induces tip clustering of the free ends of the carbon nanotubes 40, as described above and shown in particular in FIGS. 5-7. The source 62, preferably includes carbon tetrafluoride with a carrier which is preferably acetylene. The acetylene provides a source of hydrogen and additional carbon to create the hydrophobic polymer coating. In a practical embodiment, the carbon tetrafluoride and acetylene are provided at a ratio of substantially 90% to 10%, respectively.

The deposition step for depositing the hydrophobic coating is preferably carried out by plasma deposition at about 100° C. and preferably at a pressure of around 1.2 Torr. In practice, the low power plasma can be generated by means of a 30 Watt total power applied to a Ø220 mm electrode.

It is believed that the use of a carbon tetrafluoride and acetylene mix in the plasma creates a carbon fluorine polymer-like coating which is highly hydrophobic and very stable. As explained above, it has been found that carbon tetrafluoride per se may be used successfully, that is without an acetylene or other reactant in the plasma, to form a hydrophobic coating on the layer of carbon nanostructures. The other precursors mentioned herein can likewise be used without an additional reactant in the plasma. Further examples of suitable precursors include chlorotrifluoromethane (CF3CL), bromotrifluoromethane (CF3Br), trifluoroiodomethane (CF3I), tetrafluoroethylene (C2F4). It is also possible to use nitrogen trifluoride (NF3) and boron trifluoride (BF3), as well as pure fluorine (F2). It is believed that a fluorine or fluorine based precursor in the absence of carbon in the precursor or a separate carbon source will form a functionalised fluorocarbon coating on the carbon nanostructure layer.

Other fluoropolymers may be used, such as polyvinyl fluoride (PVF), polyvinylidene fluoride (PVDF), polytetrafluoroethylene (PTFE), fluorinated ethylene-propylene copolymers (FEP), perfluoro alkoxylated polyfluoroolefins (PFA), and related fluorocarbon and chlorofluorocarbon polymers, which are all good examples of thermally stable, chemically inert materials which can be used to increase the water resistance of materials or structures.

Fluorinated organic monomers can be either surface etching in nature or plasma polymerizing in nature. This characteristic depends on the atomic fluorine to fluorocarbon ratio. The addition of hydrogen or hydrocarbon species will reduce the amount of atomic fluorine and reduce the etching effect in favour of the polymerisation reaction. The plasma polymer deposited is a polyfluoro-olefin type compound but, as with all plasma polymers, will not demonstrate long range regularity as with a traditional polymer such as PTFE. A highly cross-linked polymer with a range of C—C and C—F functionalities is expected to be formed under the taught conditions. Such a polymer could be prepared from a range of organic and fluorinated precursors or mixtures thereof including but not limited to $CF_4$, $C_6F_{14}$, $C_3F_8H_2$, $C_2F_6$, $C_2F_4$, $C_3F_6$, $C_2H_2$, $C_2H_4$, $CF_4$—$H_2$, $CF_4$—$C_2F_4$, $C_2F_6$—$H_2$. The presence of trace amounts of oxygen in the feed gas can inhibit the formation of plasma polymerized thin films and enhance the etching characteristic of the gas. It is believed that small amounts of oxygen trapped in the carbon nanotube array may react with the fluorine in the initial phase of processing, helping to etch and agglomerate the carbon nanotube tips, thereby causing an improvement in film absorption. A balance with the amount of oxygen retained or used may ensure optimal tip clustering without impinging on significantly on the polymerisation of the films.

The deposition is carried out with a substrate temperature of between 50 and 150° C., or more. The chemical inertness of fluoropolymers is due to the fluorine atoms acting as a protective sheath surrounding the carbon-carbon backbone. The hydrophobicity of the resultant film is then related to the ratio of intact $CF_3$ and $CF_2$ groups compared to isolated, highly polar, fluorine moieties such as C—CF and so the plasma power and hence the fragmentation of the precursors should be limited to avoid complete dissociation of the precursor molecules. The carbon nanotube surfaces, if defective (Raman bands G:D≥1), will provide high energy nucleation points favourable to efficient sticking of the radical monomers allowing for very fast deposition and functionalization rates. Defect sites in the tube walls will selectively react with the $CF_x$ radicals formed in the plasma chamber and polymerisation will proceed initially from these sites. Such defects would otherwise serve as water interaction sites and contribute to continued carbon nanotube agglomeration through capillary action in high humidity environments, leading to destruction of the film's electromagnetic absorbing properties.

The deposition/functionalization step can completely prevent water ingress or uptake even with complete immersion of a coated article in a water bath. A typical process time of 12 seconds not only provides super-hydrophobicity, but can also improve the total hemispherical reflectance (THR) of the coating by approximately 30% or more across the wavelength range compared with an uncoated carbon nanotube array.

The hydrocarbon to fluorinated monomer ratio should be kept as low as possible to maximise the fluorine content of the final polymer while minimising the etchant effect of the fluorine radicals. Ideally a 9:1 volume ratio of fluorine monomer to hydrocarbon is used but a range from 20-90% fluorocarbon can produce a similar film with some alterations in the plasma conditions. The power used to ignite the plasma is chosen to be low to limit fragmentation of the monomer, however, a power density in the range $0.04 \geq W \geq 0.25$ W cm$^{-2}$ is ideal in most cases both to maintain a stable plasma and to form a highly hydrophobic coating whilst clustering the nanostructure tips. Other plasma powers might be used as these are strongly dependent on reactor design and gas flows. An increase in power results in a greater degree of crosslinking and an increased density. Too high a power however, will result in a decrease in hydrophobicity due to a lack of $CF_3$ and $CF_2$ functionality. The power required to ignite a plasma will depend on the nature of the precursors, the pressure and the size of the reactor and so will have a range of values. Similarly, the volume of the reactor and pressure required inside the deposition chamber will have a range of values depending on the precursors and shape and size of the item to be coated. Silverstein et al (M. S. Silverstein et al, Pol. Eng. Sci, 36, p 2542, 1996) calculated a dimensionless plasma parameter E which can be used to relate monomer type to plasma conditions and hence polymer nature, either "power starved" or "monomer starved":

$$E = \frac{2W}{M_w(F_n)^3}\left(\frac{PA}{RT}\right)^2$$

where W is the applied power (Watts), $M_w$ is the monomer molecular weight (g/mol), $F_n$ is the molar flow rate (sccm), P is the steady state pressure (mTorr), A is the reactor cross sectional area (cm$^2$), and R is the gas constant (J mol$^{-1}$ K$^{-1}$), and T is the steady state temperature (K).

This relationship demonstrates the interplay between the parameters and, for example, shows that an increase in flow rate or a heavier precursor will require a higher power for similar polymerisation efficiency. Using a combination of relatively high flow rates and low power, E is expected to be in the range $10^{-3} \geq E \geq 10^0$ in preferred embodiments.

In a further aspect of the invention there is provided a method of forming a low reflectivity hydrophilic coating on a substrate, which coating includes a layer of carbon nanostructures attached to a substrate and extending away from the substrate, the carbon nanostructure layer having an internal side and an exposed side, the internal side facing the substrate, the carbon nanostructures having tips at the exposed side of the of the carbon nanostructure layer; the method including the steps of:
  generating a plasma at the layer of carbon nanostructures, the plasma including fluorine and carbon or an organosilane and carbon components;
  causing by means of the plasma:
    a) the tips of the carbon nanostructures to cluster together and
    b) a coating of fluorocarbon or organosilane to be formed over the carbon nanostructure layer, wherein the coating is hydrophobic.

Example 1

Plasma deposition was conducted with a 13.56 MHz RF generator and gases were delivered via a shower head delivery system of the type disclosed and referred to above. The carbon nanotube sample was placed in the reactor and evacuated, the sample was allowed to come to temperature at 100° C. for 10 min. In one instance, $CF_4$ (90 sccm) and $C_2H_2$ (10 sccm) were flowed into the reactor and the pressure was allowed to stabilise at 1.2 Torr. The plasma was ignited at 30 W and the reaction was allowed to proceed for between 5 and 20 seconds. The resultant sample was removed from the chamber and stored at room temperature in air for subsequent analyses.

Figure 8:
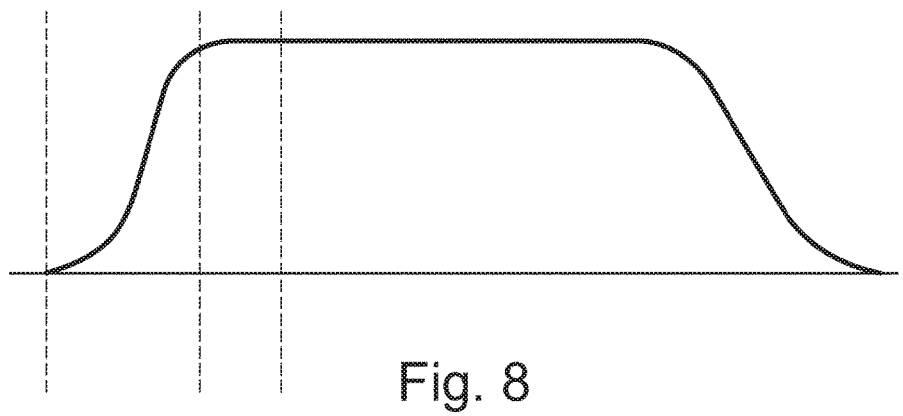
FIG. 8 is a schematic depicting the improvement in film absorption vs deposition time

Referring now to FIG. 8, this shows a graph of the expected coating parameters achieved by the apparatus 50/100 disclosed herein. Where the process has an initial step of forming an oxygen plasma to cluster, or cause to agglomerate, the free ends of the carbon nanotubes, it has been found that the optimum period for the oxygen plasma is around 15 seconds, after which there is no improvement in the structural characteristics of the carbon nanostructure layer 40, in that there is virtually no change in reflectivity.

It has been found that around 8 seconds of a carbon tetrafluoride-based plasma is optimal for hydrophobic coating, and that beyond this period the hydrophobic coating becomes too thick, resulting in an increase in reflectivity. It is preferred in this regard that the hydrophobic coating over the tips carbon of the nanotubes has a thickness of no more than a few tens of nanometers (T in FIG. 7).

Figure 9:
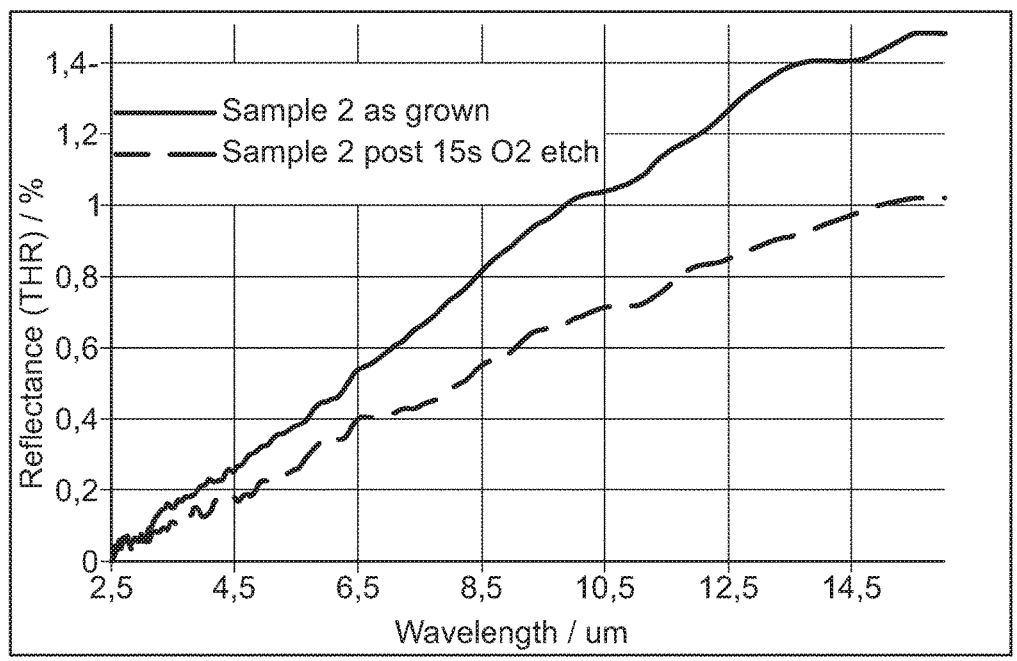
FIG. 9 is a graph showing the improvement in reflectance for a coating treated solely by oxygen etching.
Figure 10:
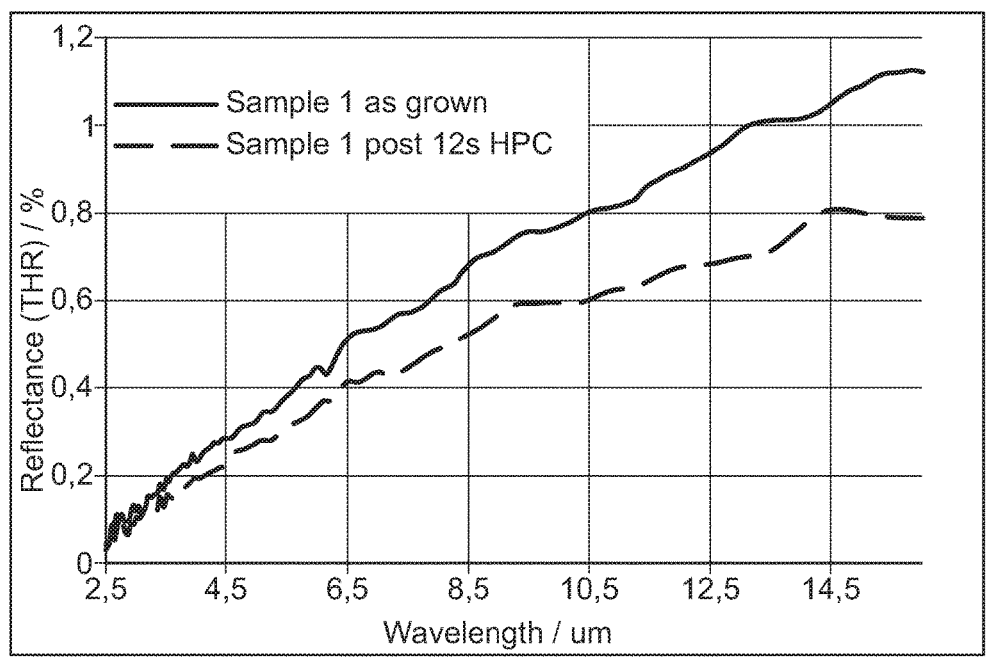
FIG. 10 is a graph showing the improvement in reflectance for a coating provided with a hydrophobic coat thereon.

Referring now to FIGS. 9 and 10, the graph of FIG. 9 shows the improvement in reflectance for an oxygen plasma etched surface. This leaves the coating very hydrophilic which means the coating loses its optical properties when exposed to moisture or is destroyed when water directly impacts it. The graph of FIG. 9 demonstrates that functionalising the surface with a plasma-assisted CF4/C2H2 according to the teachings herein results in the same performance improvement as can be achieved using a plasma-assisted oxygen etch. However, the CF4/C2H2 process results in a super hydrophobic film that is not damaged or otherwise negatively affected by moisture.

It will be appreciated that described above are embodiments of the teachings herein and that the nature of the carbon nanostructure layer 60 and of the coating 80/82 will vary in dependence upon the intended use of the substrate 22 and also the operating conditions in which it is to be used. The nature of the layer 40 may also vary in dependence upon the radiation which it is desired that the layer 40 absorbs. In many instances, it will be desired that the layer 60 will absorb radiation in a large frequency band from ultra-violet to infra-red and beyond, whereas in other embodiments the layer 40 may be tuned to absorb only some wavelengths, achieved by altering the length of the carbon nanotubes 40 and their density on the exposed surface of the substrate 22.

Comparative Example 2 (O2 Plasma Only)

A previously grown CNT forest on an aluminium coupon was loaded into a plasma chamber. The chamber is pumped down to between $10^{-2}$ and $10^{-3}$ Torr using a rotary vane pump or similar. The plasma conditions used are 0.26 W cm$^{-2}$, 2 Torr, 300 sccm O2, 650 MILS spacing and the plasma was sustained for 15 seconds. The sample was removed and its reflectance measured. A 25-35% drop in reflectance was observed across the spectrum. The sample's resistance to a drop of ultra-pure water being placed on it was assessed and it was seen to be readily wetted by the drop resulting in almost complete collapse of the forest in a matter of minutes.

Example 3 (CF4-C2H2 Plasma—12 s)

Figure 11:
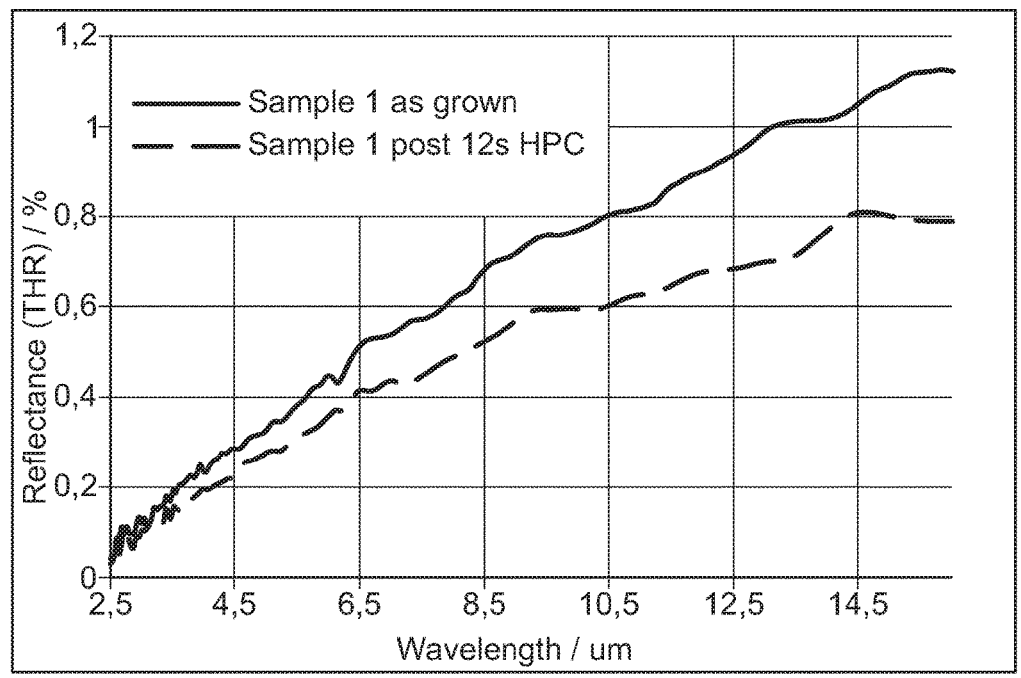
FIG. 11 shows a graph of reflectance as a function of wavelength and a photograph for a comparative sample not in accordance with the invention.
Figure 11:
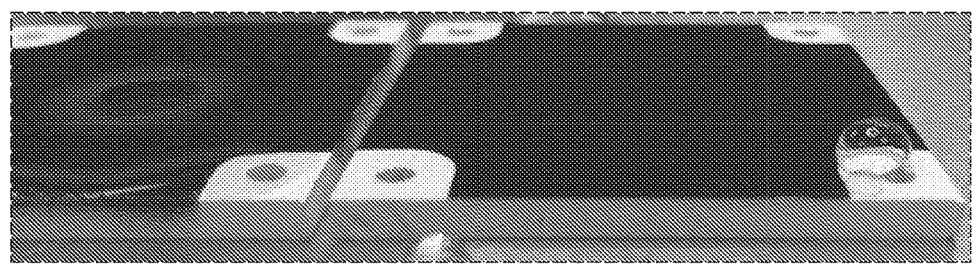
Figure 12:
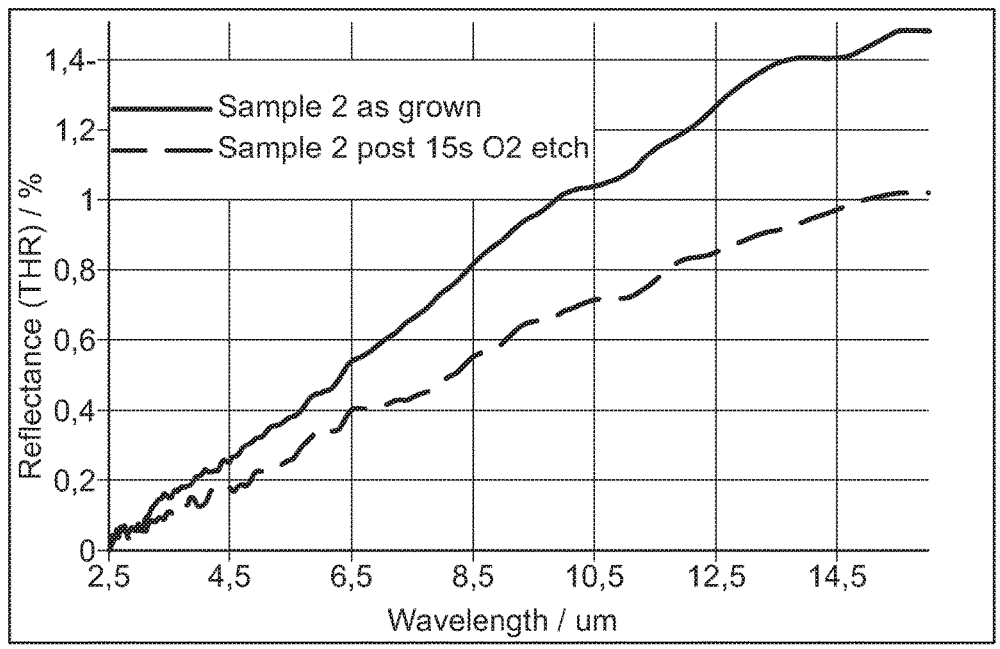
FIG. 12 is a graph showing the improvement in reflectance for a coating provided with a hydrophobic coat in accordance with the invention and a photograph of said sample.
Figure 12:
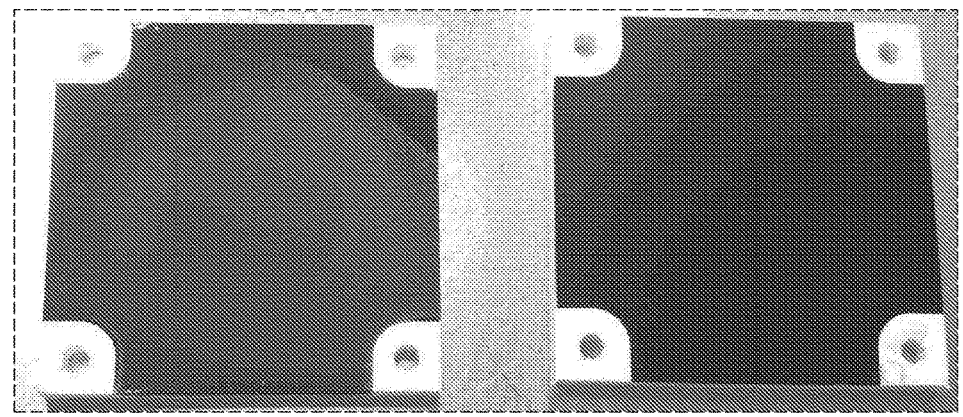

A previously grown CNT forest on an aluminium coupon was loaded into a plasma chamber. The chamber is pumped down to between $10^{-2}$ and $10^{-3}$ Torr using a rotary vane pump or similar. The plasma conditions used are CF4(90)-C2H2(10), 1.2 Torr, 100° C., 30 W (0.07 W cm$^{-2}$) and the plasma was sustained for 12 seconds. The sample was removed and its reflectance measured. A 25-35% drop in reflectance was observed across the spectrum as with the O2 etched sample. The sample's resistance to a drop of ultra-pure water being placed on it was assessed and it was seen to behave in a super hydrophobic manner with no wetting possible and the drops rolled away. A comparison of the two samples can be seen in FIGS. 11 and 12.

Comparative Example 4: (CF4-C2H2 Plasma—120 s)

Figure 13:
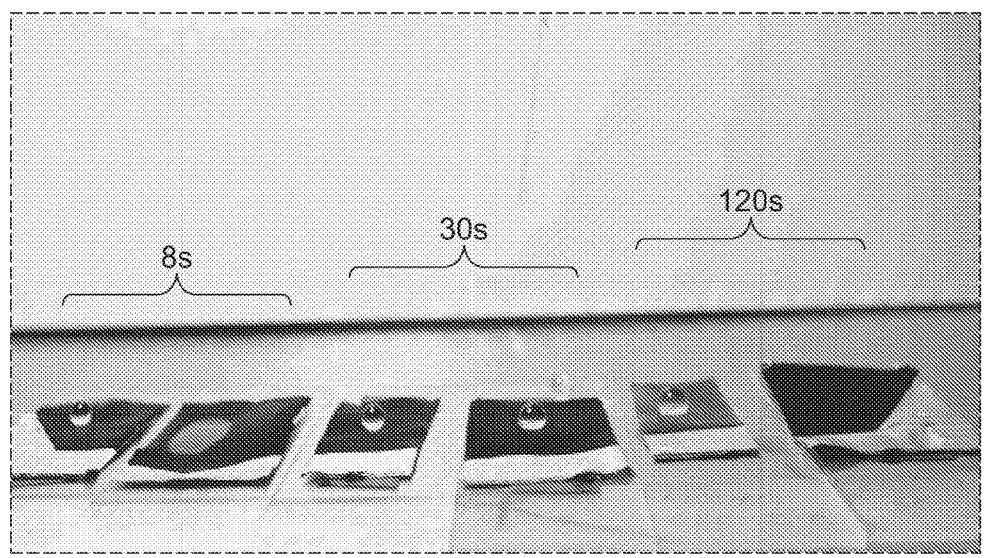
FIG. 13 shows photographs of various different samples and comparative samples showing the difference in hydrophobicity depending on how they are coated.
Figure 14:
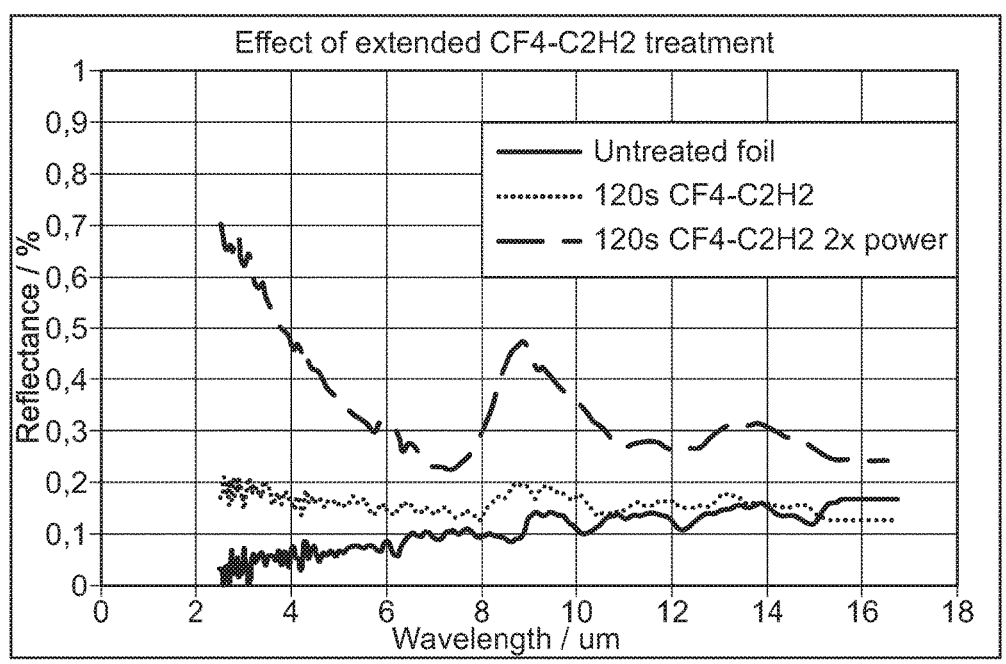
FIG. 14 shows the IR-THR spectra of three samples with extended CF4-C2H2 coatings.

A previously grown CNT forest on an aluminium coupon was loaded into a plasma chamber. The chamber is pumped down to between $10^{-2}$ and $10^{-3}$ Torr using a rotary vane pump or similar. The plasma conditions used are CF4(90)-C2H2(10), 1.2 Torr, 100° C., 30 W (0.07 Wcm$^{-2}$) and the plasma was sustained for 120 seconds. A clear visible change to the sample had occurred with a relatively shiny grey appearance. The measured reflectance in the range <2 um begins to increase which is further evidenced by increasing the power of the deposition as in FIG. 14. Although the sample did not wet with water (FIG. 13) the contact angle was seen to decrease after this extended coating due to the polymer acting to smooth out the nanoscale roughness of the CNT forest. This coating was deemed to be too thick having a negative impact on the samples low reflectance characteristics.

Comparative Example 5: (CF4 Plasma—8 s)

A previously grown CNT forest on aluminium foil was loaded into a plasma chamber. The chamber is pumped down to between $10^{-2}$ and $10^{-3}$ Torr using a rotary vane pump or similar. The plasma conditions used were CF4 1.2 Torr, 100° C., 30 W (0.07 Wcm$^{-2}$) and the plasma was sustained for 8 seconds. After this treatment the forest did not demonstrate any improved water resistant properties as evidenced in FIG. 13 where the water droplet has been absorbed.

Comparative Example 6: (CF4 Plasma—120 s)

Figure 15:
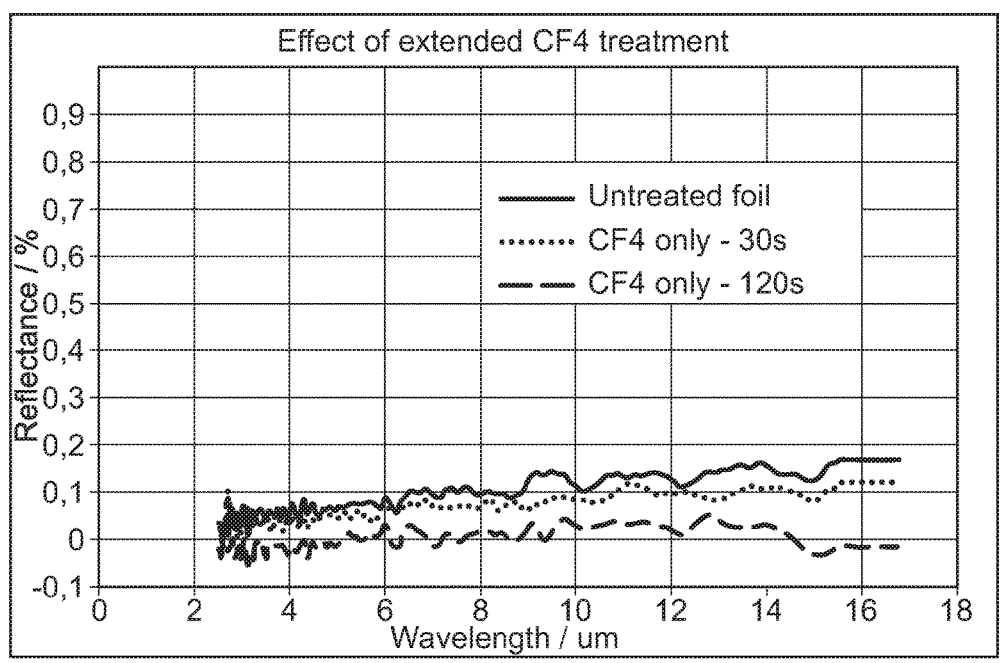
FIG. 15: shows the IR-THR spectra of three samples with extended CF4 treatments.
Figure 16:
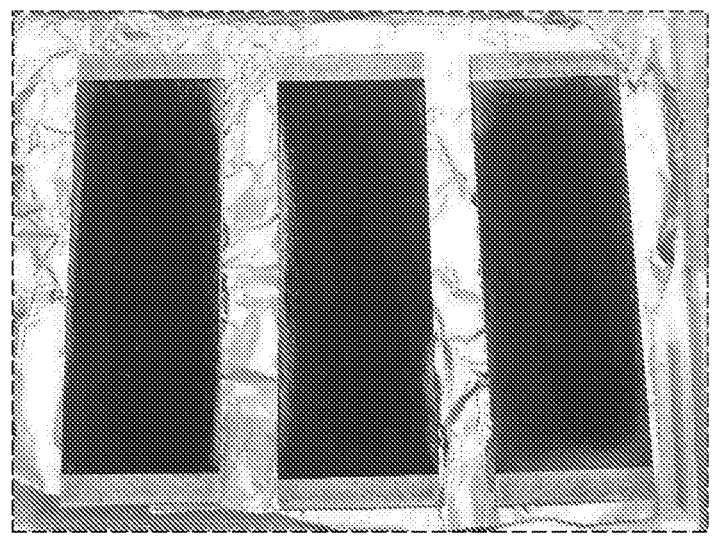
FIG. 16 is a photograph of copper coupons over-etched by CF4 plasma treatment.

A previously grown CNT forest on aluminium foil was loaded into a plasma chamber. The chamber is pumped down to between $10^{-2}$ and $10^{-3}$ Torr using a rotary vane pump or similar. The plasma conditions used were CF4 1.2 Torr, 100° C., 30 W (0.07 Wcm$^{-2}$) and the plasma was sustained for 120 seconds. The reflectance of the sample was reduced by 25-35% across the range as evidenced in FIG. 15. After this treatment the demonstrated super hydrophobic properties as evidenced in FIG. 13 with the droplet rolling off the sample without wetting. Over several days however this hydrophobicity appeared to degrade due to the instability of the functionalisation in atmospheric conditions.

Example 7: (CF4 Plasma—300 s)

Figure 17:
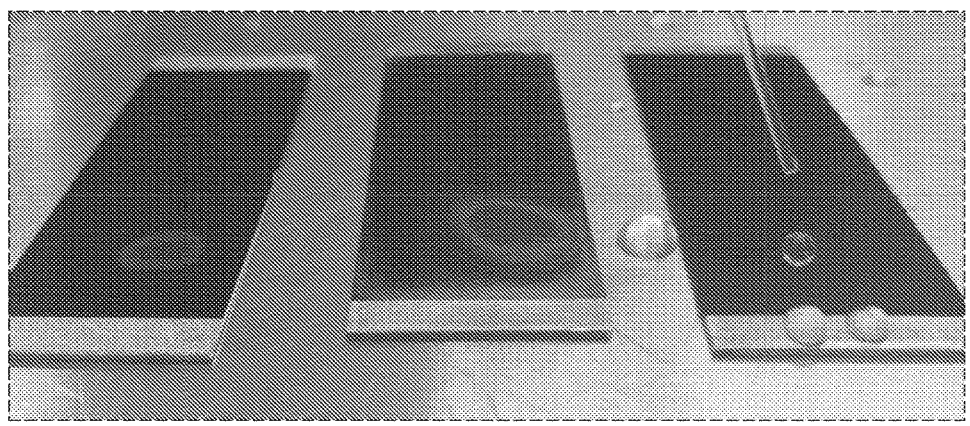
FIG. 17 is a photograph of copper coupons after treatment as described.

A previously grown CNT forest on aluminium foil was loaded into a plasma chamber. The chamber is pumped down to between $10^{-2}$ and $10^{-3}$ Torr using a rotary vane pump or similar. The plasma conditions used were CF4 1.2 Torr, 300° C., 30 W (0.07 Wcm$^{-2}$) and the plasma was sustained for 300 seconds. The reflectance of the sample was reduced by 25-35% across the range. Following this treatment, the sample demonstrated super hydrophobic properties as evidenced in FIG. 17 and was stable over a period of several months. The improved stability is attributed to both the increased time of exposure to CFx radicals and the increased temperature.

Example 8: (CF4 Plasma—900 s)

A previously grown CNT forest on copper plate was loaded into a plasma chamber. The chamber is pumped down to between $10^{-2}$ and $10^{-3}$ torr using a rotary vane pump or similar. The plasma conditions used were CF4 1.2 Torr, 300° C., 30 W (0.07 Wcm$^{-2}$) and the plasma was sustained for 900 seconds. After this treatment the forest was found to be over etched and non-uniform degrading its performance as an absorber. Having removed so much of the nanotube structure the sample was also no longer hydrophobic by nature.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in UK patent application numbers 1515271.3 and 1516424.7, from which this application claims priority, and in the abstract accompanying this application are incorporated herein by reference.

The invention claimed is:

1. A method of forming a low reflectivity hydrophobic coating on a substrate, including the steps of:
    providing in a reaction chamber a substrate having a layer of carbon nanostructures on the substrate,
    supplying the reaction chamber with a coating precursor which includes a fluorocarbon, and
    generating a plasma in the reaction chamber, in order to deposit a hydrophobic coating on at least a part of said layer of carbon nanostructures, wherein either the plasma generation takes place in the absence of a source of hydrogen atoms, in which case the substrate is heated to at least 100° C., the power density of the plasma is not more than 0.1 Wcm$^{-2}$ and the plasma is generated for a period from 3 to 12 minutes, or the plasma generation takes place in the presence of a source of hydrogen atoms, in which case the power density of the plasma is not more than 0.2 Wcm$^{-2}$ and the plasma is generated for a period from 5 to 14 seconds.

2. A method as claimed in claim 1, wherein the carbon nanostructure layer has an internal side and an exposed side with the internal side facing the substrate and the carbon nanostructures having tips at the exposed side.

3. A method as claimed in claim 1, including the step of drying said layer before the hydrophobic coating is deposited thereon.

4. A method as claimed in claim 1, wherein the plasma generation takes place in the presence of acetylene.

5. A method as claimed in claim 1, wherein the carbon nanostructure layer is surface energy modified to a depth of at least three micrometers or over the full length of the carbon nano structures.

6. A method as claimed in claim 1, wherein the hydrophobic coating extends at least partially through a thickness of the carbon nanostructure layer.

7. A method as claimed in claim 6, wherein the hydrophobic coating extends to a depth of around 3 micrometers from a surface of the carbon nanostructure layer.

8. A method as claimed in claim 1, wherein the hydrophobic material coating is discontinuous across the carbon nanostructure layer.

9. A method as claimed in claim 1, wherein the carbon nanostructures are filamentary and extend generally from the internal side to the exposed side, the hydrophobic coating being disposed over at least a part of the length of the filamentary nanostructures.

10. A method as claimed in claim 9, wherein the filamentary nanostructures are straight, curved or wavy.

11. A method as claimed in claim 1, wherein the coating precursor is or includes carbon tetrafluoride.

12. A method as claimed in claim 1, wherein the coating precursor is or includes one or more of: chlorotrifluoromethane (CF3CL), bromotrifluoromethane (CF3Br), trifluoroiodomethane (CF3I), tetrafluoroethylene (C2F4), nitrogen trifluoride (NF3), boron trifuloride (BF3), and fluorine (F2).

13. A method as claimed in claim 1, wherein the coating precursor is or includes: polyvinyl fluoride (PVF), polyvinylidene fluoride (PVDF), polytetrafluoroethylene (PTFE), fluorinated ethylene-propylene copolymers (FEP), perfluoro alkoxylated polyfluoroolefins (PFA), and related fluorocarbon and chlorofluorocarbon polymers.

14. A method as claimed in claim 1, wherein the coating precursor is or includes organic or fluorinated precursors or mixtures thereof including: $CF_4$, $C_6F_{14}$, $C_3F_8H_2$, $C_2F_6$, $C_2F_4$, $C_3F_6$, $C_2H_2$, $C_2H_4$, $CF_4$—$H_2$, $CF_4$—$C_2F_4$, $C_2F_6$—$H_2$.

15. A method as claimed in claim 1, wherein elements of the carbon nanostructure have a diameter of from 2 to 50 nanometers.

16. A method as claimed in claim 1, wherein elements of the carbon nanostructure have a length from 3 micrometers to 2 millimeters.

17. A method as claimed in claim 1, including the step of reducing the surface energy of uncoated areas of the carbon nanostructure layer.

18. A method as claimed in claim 1, wherein carbon tetrafluoride and acetylene are provided in the plasma generation step in a ratio of substantially 90% to 10%, respectively.

19. A method as claimed in claim 1, wherein the plasma is created in a PECVD reactor by RF, DC, PDC, microwave or remote plasma.

20. A method as claimed in claim 1, including the step of generating the plasma at about 100 degrees Centigrade by means of RF energy at a frequency of 13.56 MHz.

21. A method according to claim 20, wherein RF energy is delivered to an electrode of a plasma reactor.

22. A method as claimed in claim 1, including the step of generating the plasma at a pressure of around 1.2 Torr.

23. A method as claimed in claim 1, including the step of etching at least a part of the carbon nanostructure layer.

24. A method according to claim 23, wherein etching occurs concurrently with or prior to the coating step.

25. A method as claimed in claim 1, wherein the carbon nanostructure layer is etched by oxygen plasma treatment prior to coating.

* * * * *